(12) United States Patent
David et al.

(10) Patent No.: US 11,785,737 B2
(45) Date of Patent: Oct. 10, 2023

(54) SYSTEMS AND METHODS FOR COOLING ELECTRONIC COMPONENTS OF A VEHICLE

(71) Applicant: BorgWarner Luxembourg Automotive Systems SA, Bascharage (LU)

(72) Inventors: Pascal David, Luxembourg (LU); Mark Alan Ebenhart, Kokomo, IN (US); Marc Cipriano, Russange (FR)

(73) Assignee: Borg Warner Luxembourg Automotive Systems SA, Bascharage (LU)

( * ) Notice: Subject to any disclaimer, the term of this patent is extended or adjusted under 35 U.S.C. 154(b) by 0 days.

(21) Appl. No.: 17/580,375

(22) Filed: Jan. 20, 2022

(65) Prior Publication Data

US 2023/0232568 A1    Jul. 20, 2023

(51) Int. Cl.
*H05K 7/20* (2006.01)
*H01G 4/224* (2006.01)

(52) U.S. Cl.
CPC ......... *H05K 7/20009* (2013.01); *H01G 4/224* (2013.01); *H05K 7/20* (2013.01)

(58) Field of Classification Search
CPC ....... H05K 7/20009; H05K 7/20; H01G 4/224
See application file for complete search history.

(56) References Cited

U.S. PATENT DOCUMENTS

| | | |
|---|---|---|
| 7,266,969 B2 | 9/2007 | Hsu et al. |
| 7,830,689 B2 | 11/2010 | Nakamura et al. |
| 8,519,561 B2 | 8/2013 | Azuma et al. |
| 8,519,813 B2 | 8/2013 | MacLennan |
| 8,699,254 B2 | 4/2014 | Nishikimi et al. |
| 8,780,557 B2 | 7/2014 | Duppong et al. |

(Continued)

FOREIGN PATENT DOCUMENTS

| | | | |
|---|---|---|---|
| CN | 110335755 | * 10/2019 | ............... H01G 2/08 |
| DE | 102013222148 A1 | 5/2014 | |

(Continued)

OTHER PUBLICATIONS

CN 110335755 English translation (Year: 2019).*

(Continued)

*Primary Examiner* — Mukundbhai G Patel
(74) *Attorney, Agent, or Firm* — Joshua M. Haines; Bookoff McAndrews, PLLC

(57) ABSTRACT

A cooling system for a capacitor may include a housing for the capacitor, the housing comprising of a bottom surface, a top surface, and at least one side surface connecting the bottom surface and the top surface, the housing further including: a bottom inlet manifold and a bottom outlet manifold extending along the bottom surface; an inlet side channel extending along the side surface, the inlet side channel being in fluid communication with the bottom inlet manifold; an outlet side channel extending along the side surface, the outlet side channel being in fluid communication with the bottom outlet manifold; a top inlet manifold extending along the top surface, the top inlet manifold being in fluid communication with the inlet side channel; and a top outlet manifold extending along the top surface, the top outlet manifold being in fluid communication with the outlet side channel.

20 Claims, 9 Drawing Sheets

(56) References Cited

U.S. PATENT DOCUMENTS

| | | | |
|---|---|---|---|
| 8,971,041 | B2 | 3/2015 | Sharaf et al. |
| 9,072,189 | B2 | 6/2015 | Kosugi et al. |
| 9,445,532 | B2 | 9/2016 | Chen et al. |
| 9,615,490 | B2 | 4/2017 | Topolewski et al. |
| 10,104,814 | B2 | 10/2018 | Wagoner et al. |
| 10,141,862 | B1 * | 11/2018 | Chen ............... H05K 7/2089 |
| 10,453,776 | B2 | 10/2019 | Usui et al. |
| 10,477,733 | B1 | 11/2019 | Skalski |
| 10,701,841 | B2 | 6/2020 | Richards |
| 10,932,396 | B2 | 2/2021 | Song et al. |
| 11,063,421 | B2 | 7/2021 | Griffiths |
| 2007/0246635 | A1 | 10/2007 | Nakajima et al. |
| 2013/0039009 | A1 | 2/2013 | Shin et al. |
| 2014/0098588 | A1 | 4/2014 | Kaneko et al. |
| 2015/0342092 | A1 | 11/2015 | Ramm et al. |
| 2022/0006350 | A1 * | 1/2022 | Kang ............... H02K 9/19 |
| 2022/0142014 | A1 | 5/2022 | Ono et al. |

FOREIGN PATENT DOCUMENTS

| | | |
|---|---|---|
| DE | 102017214486 A1 | 2/2019 |
| DE | 102021100170 A1 | 7/2021 |
| DE | 102021100594 A1 | 7/2021 |
| EP | 2006989 A2 | 12/2008 |
| EP | 3653418 A1 | 5/2020 |
| EP | 3723109 A1 | 10/2020 |
| JP | 2019161979 A | 9/2019 |

OTHER PUBLICATIONS

Partial European Search Report in EP Application No. 22216225.7, dated Jun. 29, 2023 (14 pages).
Partial European Search Report in EP Application No. 22216226.5, dated Jul. 5, 2023 (15 pages).

* cited by examiner

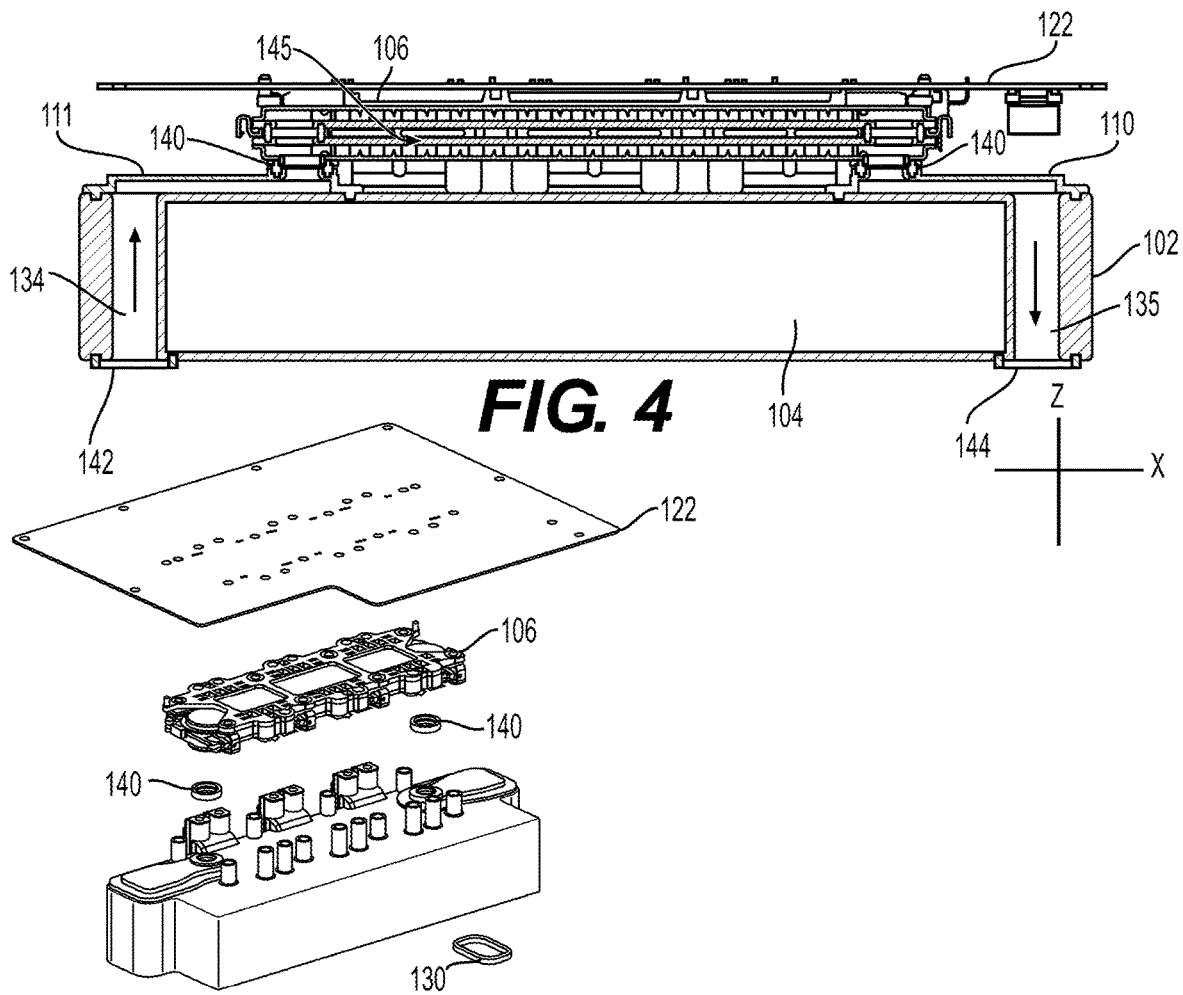
FIG. 4
FIG. 5
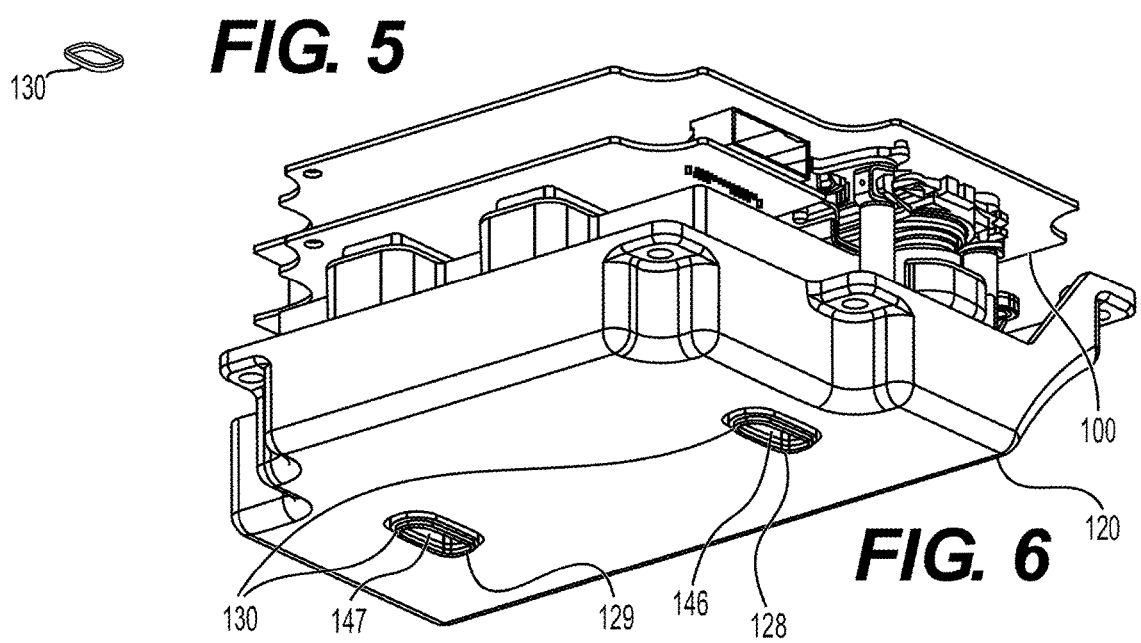
FIG. 6

SYSTEMS AND METHODS FOR COOLING ELECTRONIC COMPONENTS OF A VEHICLE

TECHNICAL FIELD

Various embodiments of the present disclosure relate generally to systems and methods for cooling electronic components of a vehicle.

INTRODUCTION

Power inverters utilize DC-Link capacitors which are used to ensure DC voltage stability and limit fluctuations as inverters sporadically demands heavy current. For operational and lifetime purposes the DC-link capacitor has to be cooled down.

Thermal conductivity can be used to cool the DC-Link capacitor. The DC-Link capacitor is generally placed on top of a power module and attached to the inverter housing. The power and control board is generally situated in between the power module and the inverter housing. All mounting points are included into the inverter housing and have to be machined after pressure die-casting process.

SUMMARY OF DISCLOSURE

A cooling system for a capacitor may include a housing for the capacitor, the housing comprising of a bottom surface, a top surface, and at least one side surface connecting the bottom surface and the top surface, the housing further including: a bottom inlet manifold and a bottom outlet manifold extending along the bottom surface; an inlet side channel extending along the side surface, the inlet side channel being in fluid communication with the bottom inlet manifold; an outlet side channel extending along the side surface, the outlet side channel being in fluid communication with the bottom outlet manifold; a top inlet manifold extending along the top surface, the top inlet manifold being in fluid communication with the inlet side channel; and a top outlet manifold extending along the top surface, the top outlet manifold being in fluid communication with the outlet side channel.

The top inlet manifold includes an opening, and the top outlet manifold includes an opening, wherein the opening of the top inlet manifold and the opening of the top outlet manifold are fluidically separated in the absence of an intermediate conduit. The bottom inlet manifold includes: a cavity; a flange extending circumferentially around the cavity; and a protrusion extending from the flange, the protrusion also extending circumferentially around the cavity. The bottom surface of the housing includes an inlet manifold recess having a shape corresponding to a shape of the protrusion, wherein the inlet manifold recess receives the protrusion of the bottom inlet manifold when the bottom inlet manifold is coupled to the bottom surface. In a first plane, the protrusion extends completely and uninterrupted around a first circumference of the cavity. In a second plane substantially parallel to the first plane, the flange extends completely and uninterrupted around a second circumference of the cavity. The bottom outlet manifold includes: a cavity; a flange extending circumferentially around the cavity; and a protrusion extending from the flange, the protrusion also extending circumferentially around the cavity, wherein: the bottom surface of the housing includes an outlet manifold recess having a shape corresponding to a shape of the protrusion of the bottom outlet manifold, wherein the outlet manifold recess receives the protrusion of the bottom outlet manifold when the bottom outlet manifold is coupled to the bottom surface; in the first plane, the protrusion of the bottom outlet manifold extends completely and uninterrupted around a first circumference of the cavity of the bottom outlet manifold; and in the second plane, the flange of the bottom outlet manifold extends completely and uninterrupted around a second circumference of the cavity of the bottom outlet manifold. The cavity of the bottom inlet manifold forms part of an inlet cooling circuit when the bottom inlet manifold is coupled to the bottom surface of the housing, and the cavity of the bottom outlet manifold forms part of an outlet cooling circuit when the bottom outlet manifold is coupled to the bottom surface of the housing. The cooling system may further including a casting housing configured to at least partially receive the housing for the capacitor. The casting housing is configured to be directly attached to a frame of a vehicle. The casting housing is formed substantially of metal and the housing for the capacitor is formed substantially of plastic. The casting housing includes inlet opening and an outlet opening, wherein a portion of the bottom inlet manifold extends through the inlet opening, and a portion of the bottom outlet manifold extends through the outlet opening. The inlet opening and the outlet opening are the only portions of the casting housing through which a coolant is configured to flow. The cooling system, further including the capacitor, wherein the capacitor is enclosed by the housing. An electrically-powered vehicle including the cooling system.

A cooling system for a capacitor may include a housing for the capacitor, wherein the housing is formed substantially of plastic; and a casting configured to at least partially enclose the housing, the casting being formed substantially of metal, wherein the housing and casting together form an inlet coolant circuit configured to convey coolant toward the capacitor, and an outlet coolant circuit configured to convey coolant away from the capacitor, wherein the inlet coolant circuit and the outlet coolant circuit are configured such that no surface of the casting is in direct contact with any coolant.

The casting housing includes inlet opening and an outlet opening, wherein a portion of the inlet coolant circuit extends through the inlet opening and a portion of the outlet coolant circuit extends through the outlet opening. The casting housing is configured to be directly attached to a frame of a vehicle. The casting housing is formed substantially of metal and the housing for the capacitor is formed substantially of plastic.

The cooling system, wherein further including the capacitor, wherein the capacitor is enclosed by the housing.

A method of cooling electrical components of a vehicle, the method may include: directing coolant through a capacitor housing into a power module containing one or more inverters.

The capacitor housing encloses a capacitor. The capacitor housing is formed substantially of plastic. The power module is mounted above the capacitor housing relative to a bottom of the vehicle. There is no separate heat sink or thermal pad directly coupled to the power module. The vehicle further includes a substantially metal casting mounted to a frame of the vehicle, wherein the metal casting at least partially encloses the capacitor housing. The method further including directing the coolant from a heat exchanger, through an inlet opening of the metal casting, and then through the capacitor housing. The method further including directing coolant heated by the power module, away from the power module, through the capacitor housing. The method further including directing coolant heated by the power module, from the capacitor housing, through an outlet opening of the metal casting to the heat exchanger. The inlet opening and the outlet opening of the casting are the only portions of the casting through which the coolant extends. None of the coolant directly contacts any surface of the metal casting.

A method of cooling electrical components of a vehicle, the method may include: directing coolant from a coolant loop into a power module containing one or more inverters, wherein (1) the power module is coupled to a substantially metal casting that is mounted to a frame of the vehicle, and (2) none of the coolant from the coolant loop directly contacts any surface of the metal casting.

There is no separate heat sink or thermal pad directly coupled to the power module. The metal casting at least partially encloses a capacitor housing. The method further including directing the coolant from a heat exchanger, through an inlet opening of the metal casting, and then through a capacitor housing. The method further including directing coolant heated by the power module, away from the power module, through a capacitor housing. The method further including directing coolant heated by the power module, from the capacitor housing, through an outlet opening of the metal casting to the heat exchanger. The inlet opening and the outlet opening of the casting are the only portions of the casting through which the coolant extends. None of the coolant directly contacts any surface of the metal casting.

A method of cooling electrical components of a vehicle, the method may include: directing coolant through a coolant circuit to cool the electrical components, wherein the electrical components are secured to the vehicle by a metal casting that is mounted to a frame of the vehicle, wherein the coolant extends through the metal casting at only two openings.

An electrical assembly for a vehicle, the electrical assembly may include: a casting configured to be mounted directly to a frame of the vehicle; a capacitor housing disposed at least partially within the casting; a capacitor disposed within the capacitor housing; and a power module including one or more inverters, the power module being disposed above a top surface of the capacitor housing.

The capacitor housing is formed substantially of plastic. The casting is formed substantially of metal. The power module is not directly coupled to the casting. The power module is directly coupled to the capacitor housing. A coolant circuit for cooling the power module includes portions of the capacitor housing, the casting, and the power module. The casting includes an inlet opening and an outlet opening, wherein the coolant circuit extends through both the inlet opening and the outlet opening.

No coolant disposed within the coolant circuit directly contacts any surface of the casting. The inlet opening and the outlet opening are the only portions of the casting through which coolant from the coolant circuit extends. The electrical assembly further including a printed circuit board positioned above the power module, wherein the coolant circuit does not extend through any portion of the printed circuit board. The power module includes two interior coolant channels that are parallel to one another, wherein coolant from the coolant circuit is configured to flow through each of the two interior coolant channels. The electrical assembly further including a printed circuit board positioned above the power module, wherein the printed circuit board is directly coupled to the top surface of the capacitor housing. The electrical assembly does not include a separate heat sink or thermal pad coupled to the power module. The electrical assembly further including a gap between a bottom surface of the power module and a top surface of the capacitor housing. The electrical assembly further including a heat sink or a thermal pad coupled to the power module. The heat sink or the thermal pad is coupled to a bottom surface of the power module and to the top surface of the capacitor housing. A vehicle including the electrical assembly.

A vehicle, which may include: a frame; a casting mounted to the frame; a capacitor housing disposed at least partially within the casting; a capacitor disposed within the capacitor housing; and a power module including one or more inverters disposed above a top surface of the capacitor housing.

The capacitor housing is formed substantially of plastic, and the casting is formed substantially of metal.

An electrical assembly for a vehicle, the electrical assembly may include: a casting configured to be mounted directly to a frame of the vehicle; a power module including one or more inverters a capacitor housing disposed at least partially within the casting, wherein a weight of the power module is structurally supported by the capacitor housing; and a capacitor disposed within the capacitor housing.

BRIEF DESCRIPTION OF THE DRAWINGS

The accompanying drawings, which are incorporated in and constitute a part of this specification, illustrate various exemplary embodiments and together with the description, serve to explain the principles of the disclosed embodiments.

FIG. 4 depicts a side cross sectional view of the capacitor and power module system from an alternative axis;

FIG. 5 depicts an exploded view of the capacitor and power module system;

FIG. 6 depicts a bottom perspective view of an electronic assembly;

DETAILED DESCRIPTION

Figure 1:
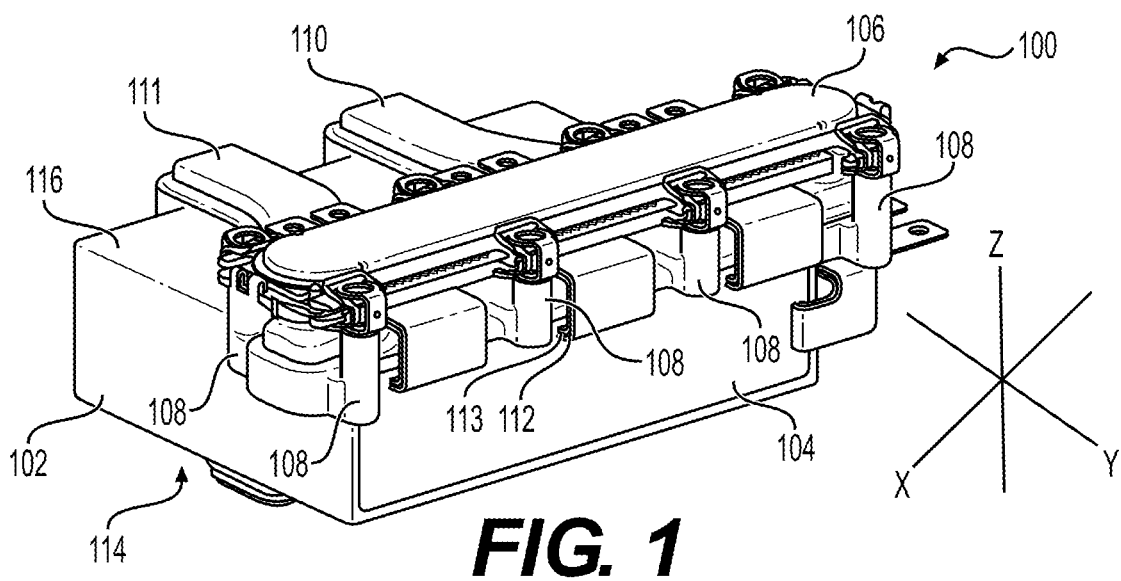
FIG. 1 depicts a perspective view of a capacitor and power module system for an electrically-powered vehicle.

FIG. 1 depicts an electronics (e.g., capacitor and power module) system for an electrically-powered vehicle 100. The capacitor and power module system 100 may include a cooling mechanism or circuits, such as a fluid circuits that transfer waste heat (e.g., heat generated while in operation) from the system 100 to a coolant associated with the fluid circuits and transfer the fluid to a radiator, heat exchanger, or other engine components, as described herein. In one embodiment, the system 100 includes a capacitor housing 102, capacitor 104 (such as, e.g., a DC-link capacitor), power module 106, connectors 108, upper manifolds 110 and 111, and electrically conductive traces 112 and 113.

The capacitor housing 102 may hold, support, enclose, and/or otherwise contain the capacitor 104. The capacitor housing 102 may be constructed substantially of plastic, but could also be made from any other suitable material including metals, alloys, and/or combinations thereof. As used herein, the phrase "being formed substantially of plastic" may be construed herein as including, for example, greater than 95% of an object's weight as being plastic. The plastic structure of capacitor housing 102 may be more flexible in terms of its packaging capabilities and mechanical layout. The capacitor housing 102 may include one or more coolant channels as set forth in further detail below. These coolant channels may also be referred to as or considered a part of fluid circuits. In some embodiments, the capacitor housing 102 may be configured to route coolant through the coolant channels in order to cool the capacitor and power module system 100 before, during, and/or after use. The capacitor housing 102 may include a bottom face 114 and a top face 116 that may be substantially parallel to the bottom face 114, although other suitable configurations, e.g., offset or non-parallel surfaces are contemplated. The capacitor housing 102 may also contain at least one side surface connecting the bottom face 114 and top face 116. In one embodiment, the capacitor housing 102 may have one or more, e.g., two upper manifolds 110 and 111 that are attached to the top face 116. In one embodiment, upper manifolds 110 and 111 may be attached to the top face by ultra-sonic welding, also known as vibration welding. The two upper manifolds 110 and 111 may be mirror images of each other about the y axis. When an upper manifold 110/111 is attached to the top face 116, these components together may define a volume that forms a part of the cooling system and channels mentioned herein. The upper manifolds 110 and 111, when attached to the top face, may include a outlet 148 and inlet 150 that are in fluid connection with the coolant channels 134 and 135 (shown in FIGS. 4 and 7) of the capacitor housing 102.

In one embodiment, the power module 106 is located on the top face 116 of the capacitor housing 102, and its weight is structurally supported by capacitor housing 102 itself. Power module 106 may include, e.g., an 800-Volt Silicon Carbide Inverter for electrified vehicles, although other suitable structures also are contemplated. The power module may include one or more silicon carbide (SiC)-based power switches that deliver relatively high power densities and efficiencies needed to extent battery range and performance. The power module 106 may contain circuitry and components that are configured to convert DC current from the electric vehicle battery to AC current, which can be utilized within the electric motor that drives the propulsion system. The power module 105 may be installed on a power board assembly. The power module 105 assembly may include one or more power switches (e.g., six), one or more (e.g., two) heatsinks or cooling jackets, and mechanical components to ensure the mechanical integrity of the power module assembly. Power module 105 may contain an array of electronic packages and input/output (I/O) devices disposed on a circuit board. The capacitor and power module system 100 may include a set of electrically conductive traces 112 and 113 that connect the capacitor 104 to the power module 106, and allow current to travel from one to the other. Each heatsink may include multiple components (e.g., three in total). The heatsink material may be selected based on the required thermal performance needed to cool the power switches. In some embodiments, the heatsinks may be similar to a radiator used in an internal combustion engine The power module 106 may be structurally connected to the capacitor housing 102. In one embodiment, the power module 106 is stacked or positioned on top of the top face 116 of the capacitor housing 102 (with respect to gravity/the ground). In this way, the capacitor housing 102 provides structural support for the power module 106. Further, the power module 106 and capacitor housing 102 may be connected in various ways, such as through screws, welding, or any other suitable mechanism. In one embodiment, connectors 108 may be used to attach the power module 106 to the capacitor housing 102. In one embodiment, the connectors 108 are embedded within and/or otherwise extend through the top face 116 of the capacitor housing 102. The connectors 108 may allow the power module 106 to attach to the capacitor housing 102. The power module 106 may have corresponding recesses that receives or clips into connectors 108. Arranging the power module 106 on top of the capacitor housing 102, so that power module 106 is supported by capacitor housing 102 may help alleviate a vertical packaging constraint that occurs when the capacitor housing is mounted above the power module.

The system's improved cooling may require less power to pump coolant through the system, thus increasing the potential mileage of the overall engine.

The problem of rooting the coolant inside the housing by using complex casting designs, machining, and Friction Stir welded elements is solved by using the plastic structure of capacitor housing 102 to perform the routing.

Figure 2:
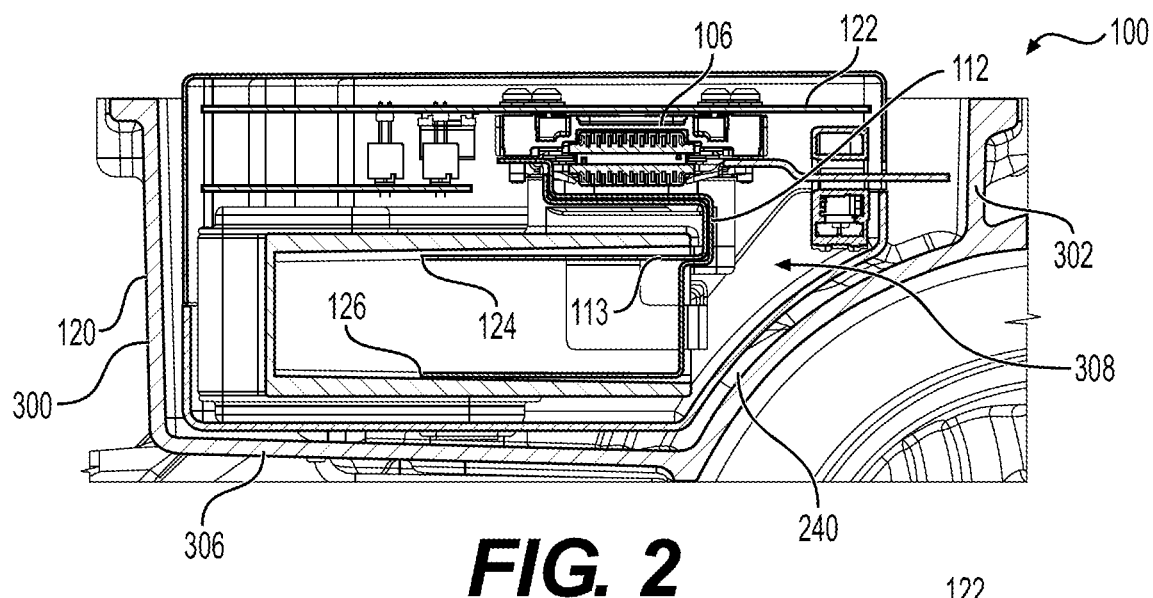
FIG. 2 depicts a side cross sectional view of system shown in FIG. 1.

FIG. 2 depicts a cross sectional view of the capacitor and power module system (e.g., power inverter) 100, with the electrical power schematic overlaid onto the figure. A housing casting (or inverter housing) 120 may be configured to at least partially receive the capacitor and power module system 100 for the electronically powered vehicle. The housing casting 120 may be configured to directly attach to a frame of a vehicle (not shown). The capacitor housing 102 may, in one embodiment, be physically and/or fluidically connected to the housing casting 120. The housing casting 120 may be constructed substantially of metal, but could also be made from any other suitable material including plastic, alloys, and/or combinations thereof. As used herein, the phrase being formed/made "substantially of metal may be defined as including over 95% metal by weight. The housing casting may be configured to provide one or more coolant channels inlets and outlets as set forth in further detail below. In one embodiment, a fluid or coolant does not directly contact any surface of the housing casting 120. Further, the housing casting 120 may include a bottom surface 306, wheel well 240, wall 302, and wall 300. The wheel well 240 may be shaped to follow the curvature of the wheel. Further, the walls of housing casting 120 may define a cavity 308 which houses the capacitor and power module 100. The housing casting 120 may at least partially enclose the capacitor housing 102 and provide structural support to capacitor housing 102. The capacitor housing 102 may be mounted to the housing casting 120 and connected in various ways, such as through screws or any other suitable mechanisms.

A printed circuit board 122 is shown in FIG. 2 having electrical circuitry, according to one embodiment. The printed circuit board 122 is located on top of the power module 106 (with respect to gravity/the ground). The circuit board 122 may include a substrate made of a low temperature co-fired ceramic (LTCC), an organic material, a metal such as stainless steel or any other suitable material. The circuit board 122 may include electrical circuitry formed on the top side surface as shown and/or bottom side surface, as well as between laminated intermediate layers of the circuit board 122. The circuit board 122 may further be configured with electrical circuitry in the form of surface mount components mounted on the circuit board, such as resistors, capacitors, diodes, transistors (e.g., FETs and IGBTs), and other semiconductor chips. The circuit board 122 may also have gate drivers and high voltage and low voltage flyback transformers. The gate voltage and transformers may work together help drive the IGBTs.

The capacitor 104 includes an input terminal 124 and an output terminal 126. The input of capacitor 104 may be coupled to a DC/DC boost converter located within the power module 106 and the output is coupled to a DC/AC output inverter located within the power module 106. The connections are coupled through traces 112 and 113.

As set forth above, the capacitor 104 or capacitor housing 102 may be used as a structural attachment support/attachment area for the power module 106 and the printed circuit board 122. Thus, printed circuit board 122, power module 106, and capacitor 104 may form a stacked structure. By stacking the capacitor 104, power module 106, and printed circuit board 122, the system has improved packaging within the housing casting 120.

The following description will make reference to FIGS. 3-7.

In one embodiment, the housing casting 120 contains two openings 146 and 147. The cross sectional view illustrates only opening 146. The openings 146 and 147 allow coolant to flow in one opening 146, through the capacitor system 100, and out the second opening 147. Openings 146 and 147 may be the only portions of the casting housing through which coolant is configured to flow. The openings may be in fluid communications with a heat exchanger or other engine components prior.

Figure 3:
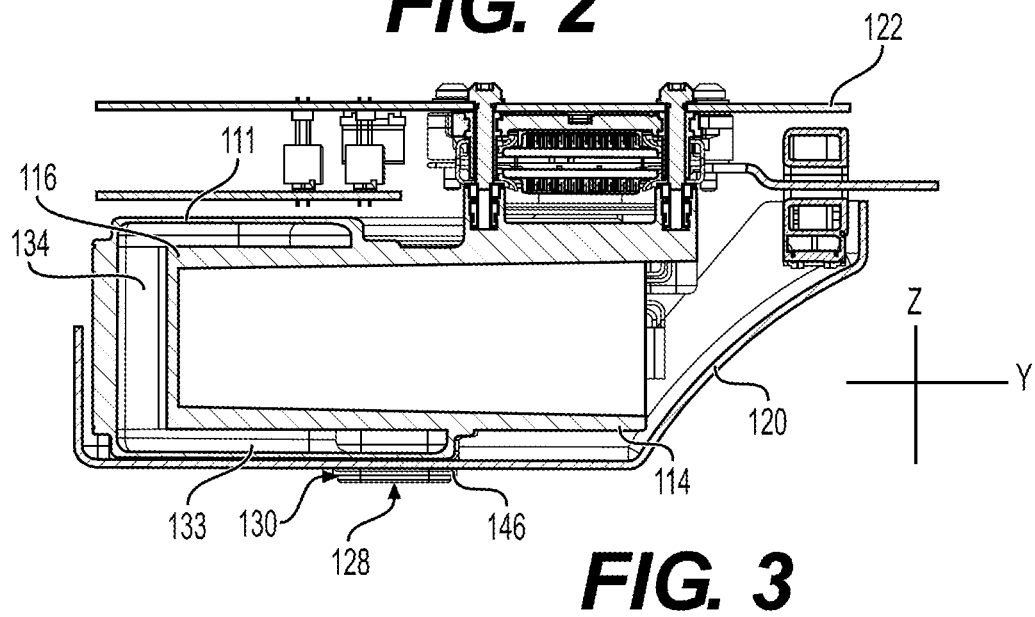
FIG. 3 depicts a side cross sectional view of the capacitor and power module system.

The capacitor housing 102 also includes lower manifolds 132 and 133, coolant channels 134 and 135, and upper manifolds 110 and 111, which allow coolant to flow through the capacitor housing 102. Coolant channels 134 and 134 may also be referred to as side channels. FIG. 3 provides a cross sectional view that depicts a single lower manifold 133, a single coolant channel 134, and a single upper manifold 111. The upper manifolds 110 and 111 are attached the top face 116 and the lower manifolds 132 and 133 are attached to bottom face 114 and may abut the housing casting 120. The lower manifolds 132 and 133 contain openings 128 and 129 in the lower manifold and are in fluid communication with openings 146 and 147 in the capacitor housing. The connection may contain lower seals 130 to prevent leakage. When the capacitor and power module 100 is received by the housing casting 120, a portion of the openings 128 and 129 of the lower manifolds 133 and 132 may extend through the corresponding openings 146 and 147 in the housing casting 120, The seals 130 may include O-rings, gaskets, resin, fiber, and/or structural barriers that block any exit paths out of thermal interfaces. In some embodiments, a portion of the coolant channel 134 may have a cylindrical shape within the capacitor housing 102, although this shape and structure is not limiting. For example, rectangular and other shaped channels also are contemplated. By integrating coolant channels through the capacitor housing 102 (as opposed to through casting 120), the dc-link capacitor cooling method is greatly simplified.

FIG. 4 displays one embodiment of the capacitor housing 102 that further depicts the coolant channels for the capacitor housing 102 and power module 106. FIG. 4 displays an opening inlet 142, which may receive coolant from lower manifold 133 (shown in FIG. 7-9). The opening inlet 142 can be in fluid communication with the first coolant channel 134. Further the system may contain upper manifolds 111 that is in fluid communication with coolant channel 134. In one embodiment, the upper manifolds 110 and 111 include upper seal 140 located at distal ends of the upper manifolds. The upper seal 140 may prevent leakage when coolant leaves the capacitor housing 102 through upper manifold 111 and enter the power module 106. The power module 106 may contain one or more coolant channels 145 (including, e.g., two or more parallel coolant channels extending therethrough) that may allow for coolant to flow through the power module 106. The system 100 further includes a second upper seal 140 that is located at the connection of the power module 106 with a second upper manifold 110 and may prevent leakage. The upper manifold 110 may be in fluid communication with a second coolant channel 135. The coolant channel 135 may have an outlet 144 that is in fluid communication with a lower manifold 132(shown in FIG. 7-9). The power module 106 and printed circuit board 122 are both located on top, from a gravitational perspective, of the capacitor housing 102. In one embodiment, neither the power module 106 nor the printed circuit board 122 are directly mounted to the housing casting 120.

FIG. 5 illustrates an exploded view of the printed circuit board 122, power module 106 and capacitor 104. The overall stacked configuration depicted in FIG. 5 has a more favorable center of gravity, which may lead to less vibrational stress on leads of the inverter. By lower the vibrational stress, this may allow for the inverter's life to be extended.

FIG. 6 displays a perspective view of the housing casting 120. In one embodiment, the housing casting 120 contains opening 146 and opening 147 extending through a bottom surface.. The openings of 146 and 147 in the capacitor housing correspond to openings in the lower manifolds 132 and 133 respectively and may be fluidly attached. Lower seals 130 may be located at the connections to prevent leakage.

In some embodiments, casting housing 120 does not include complex channels for coolant (or does not include any channels/conduit/structure through which coolant will flow). For example, in some embodiments, coolant travels through a casting housing 120 only through one of opening inlet 128 or opening outlet 129. The coolant may never directly contact any surface of the casting surface 120. Further, in one embodiment, the housing casting 120 does not include any friction stir welded elements. In some embodiments, housing casting 120 may be of unitary construction. Further, the housing casting 120 contains the capacitor and power module 100 within cavity 308. Casting housing 120 may have additional holes in the frame utilized for connecting the casting housing to the vehicle frame.

Figure 7:
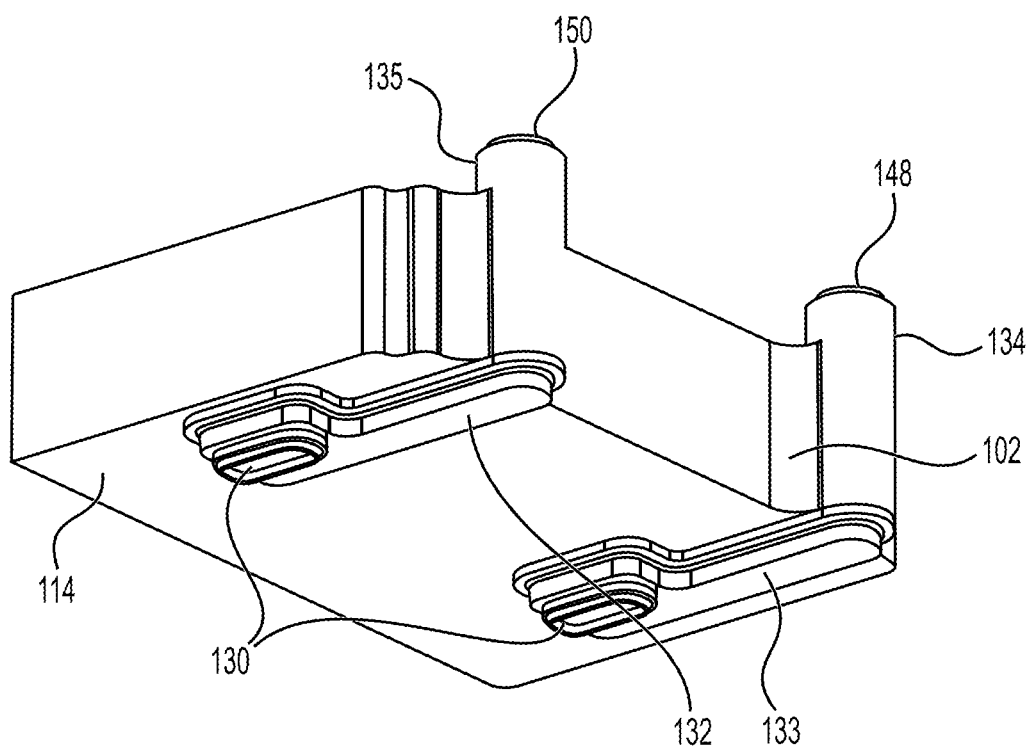
FIG. 7 depicts a bottom perspective view of a capacitor housing.
Figure 8:
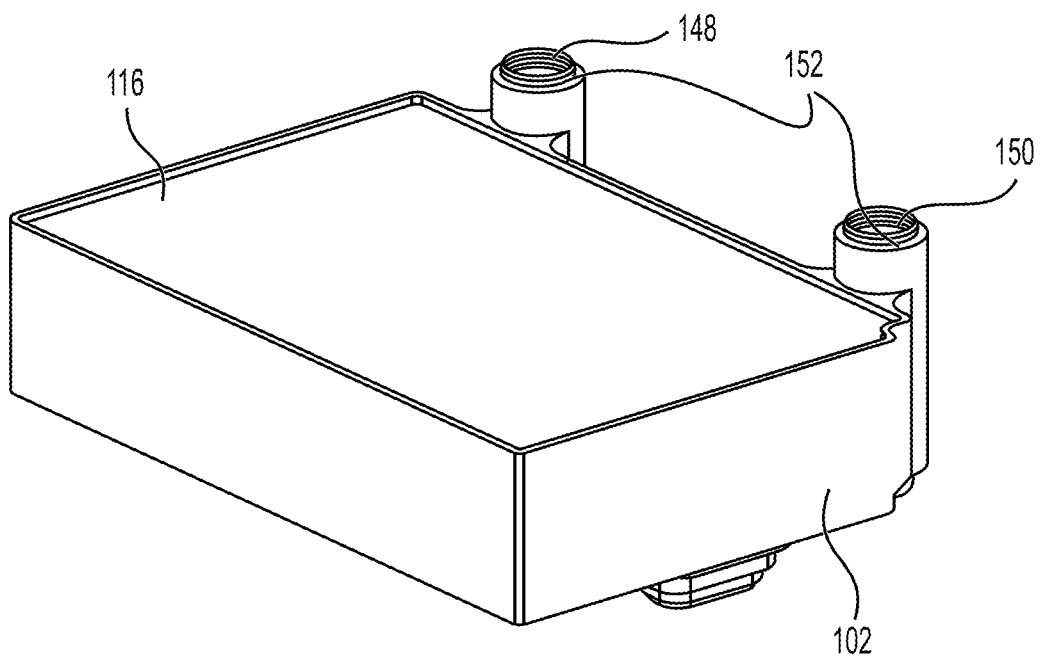
FIG. 8 depicts a top perspective view a capacitor housing.

FIG. 7 and FIG. 8 display bottom and top perspective views of one embodiment of the capacitor housing 102. The capacitor housing includes a pair of lower manifolds 132 and 133 on the bottom face 114. The lower manifolds 132 and 133 may be attached to the bottom face 114 through ultra-sonic welding, also known as vibration welding. The lower manifolds 132 and 133 may allow coolant to flow through them as set forth in greater detail below. The lower manifolds may be identical to one another, may be mirror images of one another, may be sized/shaped differently than one another, or may be related to one another in a different manner. The capacitor housing 102 may also include coolant channels 134 and 135 which contact respective coolant inlet 150 and coolant outlet 148. Further, the coolant inlet 150 and outlet 148 may extend above the top face 116 as depicted in FIG. 8, however other configurations may have the inlet 150 and outlet 148 level with top face 116 or even below the top face 116. The coolant channels 134 and 135 may be hollow and allow for fluid to flow through them. Further, this embodiment depicts lower seals 130 which may prevent leakage between the lower manifolds and an outside coolant source and sink (not shown).

FIG. 8 displays the capacitor housing 102 of FIG. 7 from a top perspective view. The additional perspective depicts capacitor housing seals 152, which may be used to prevent leakage from the coolant channels to upper manifolds 110 and 111. The seals 152 may alternatively include O-rings, gaskets, resin, fiber, and/or structural barriers that block any exit paths out of thermal interfaces.

Figure 9:
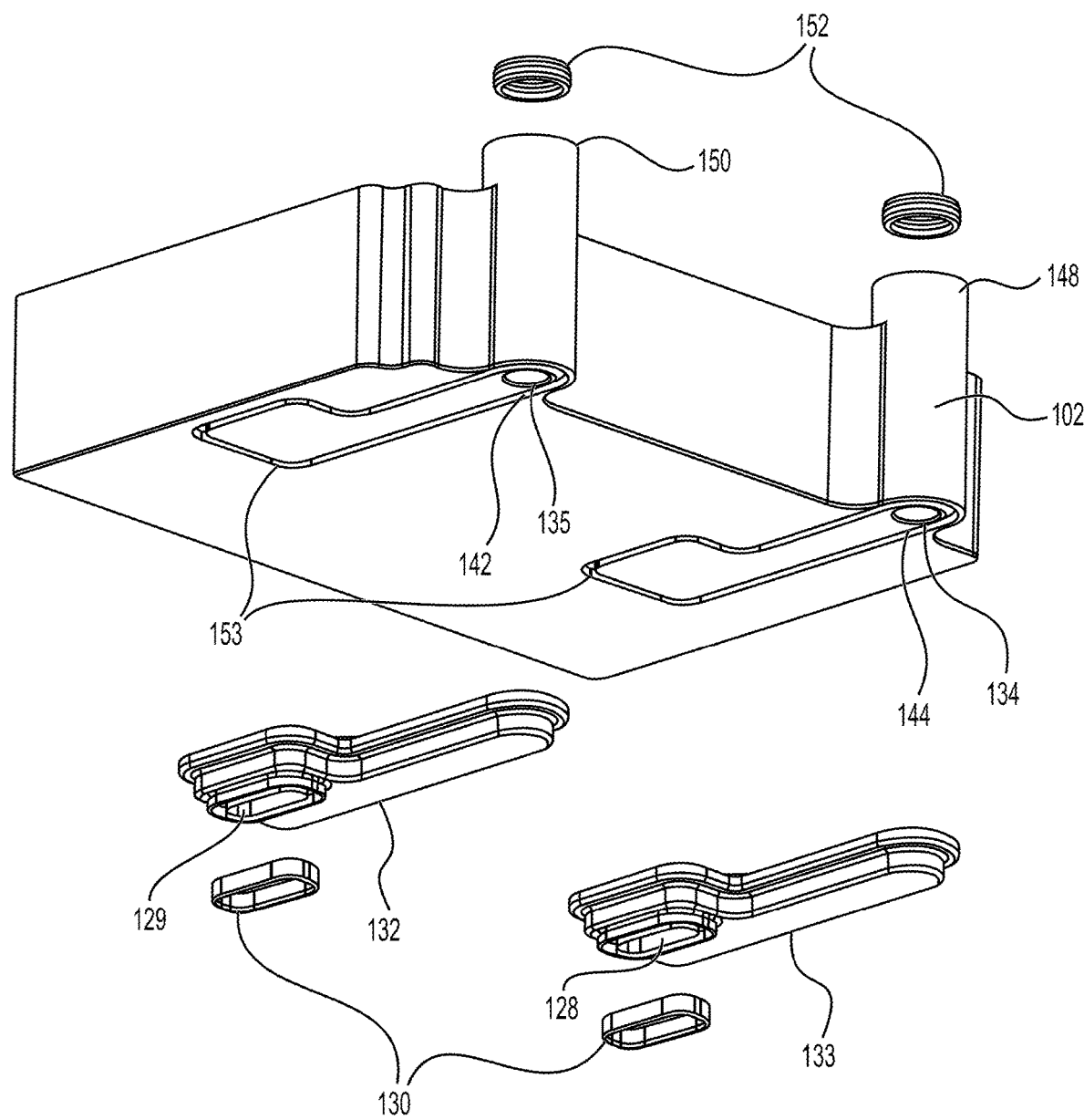
FIG. 9 depicts a bottom perspective view of a capacitor housing.

FIG. 9 displays the capacitor housing 102 of FIG. 7 and FIG. 8 from an exploded bottom perspective view. The capacitor housing 102 may include a groove or recess 153 on the bottom face 114 that correspond to the outline of the lower manifolds 132 and 133. The groove or recess 153 may be referred to as a manifold recess. The indentation 153 may have a shape that corresponds to the shape of a protrusion on lower manifolds 132 and 133. The lower manifolds 132 and 133 may be attached to the bottom face around or in the indentations.

Figure 10:
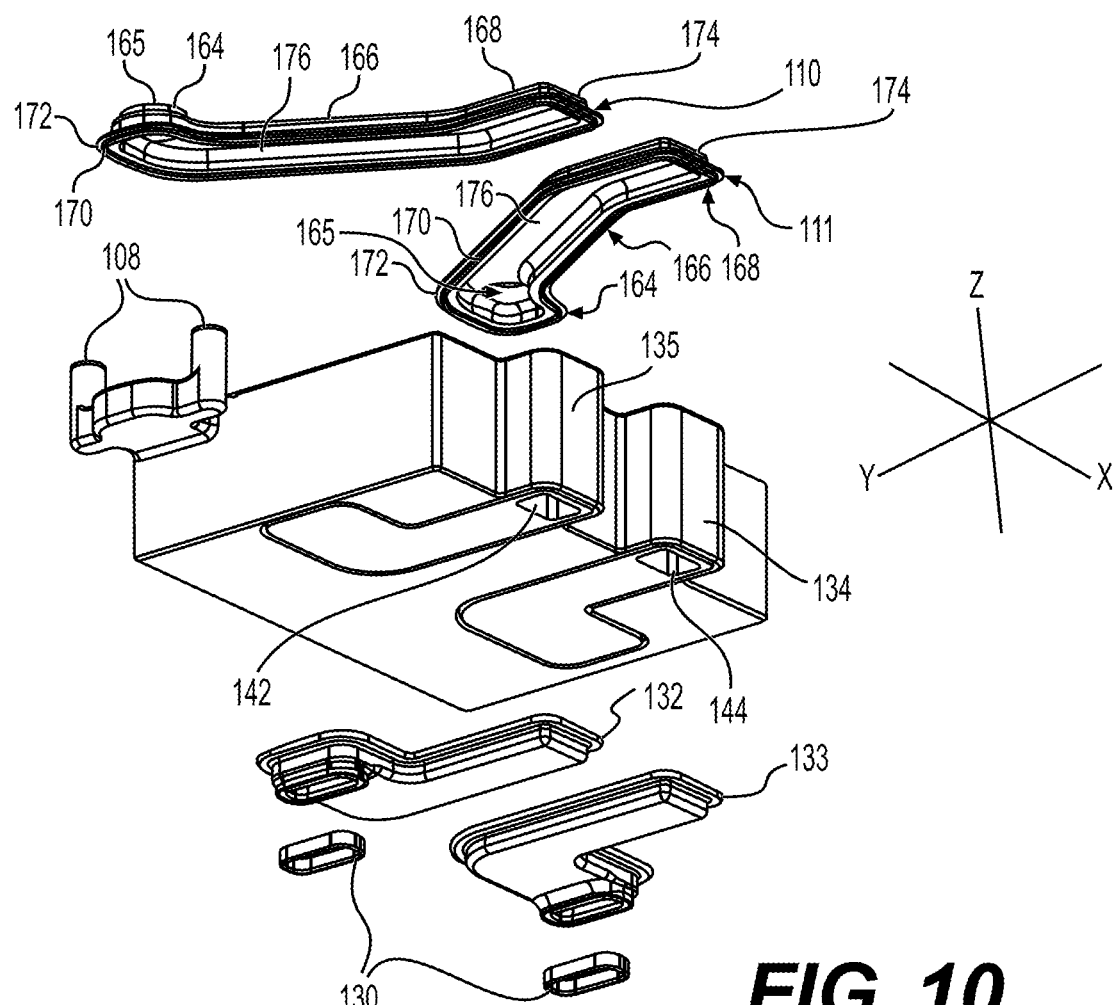
FIG. 10 depicts a bottom perspective view of a capacitor housing.

FIG. 10 displays an exploded perspective view of another embodiment of capacitor housing 102 which includes a pair of lower manifolds 132 and 133 and upper manifolds 110 and 111 that are attached to the capacitor housing 102. In this embodiment, the lower manifolds 132 and 133 and upper manifolds 110 and 111 may be mirror images of one another. Each upper manifold 110 and 111 may include an opening 165, wherein both openings 165 are fluidically separated in the absence of an intermediate conduit (e.g., in the absence of power module 106). The capacitor housing 102 may also include one or more connectors 108, which may allow for the power module to physically attach to the capacitor housing.

Figure 11:
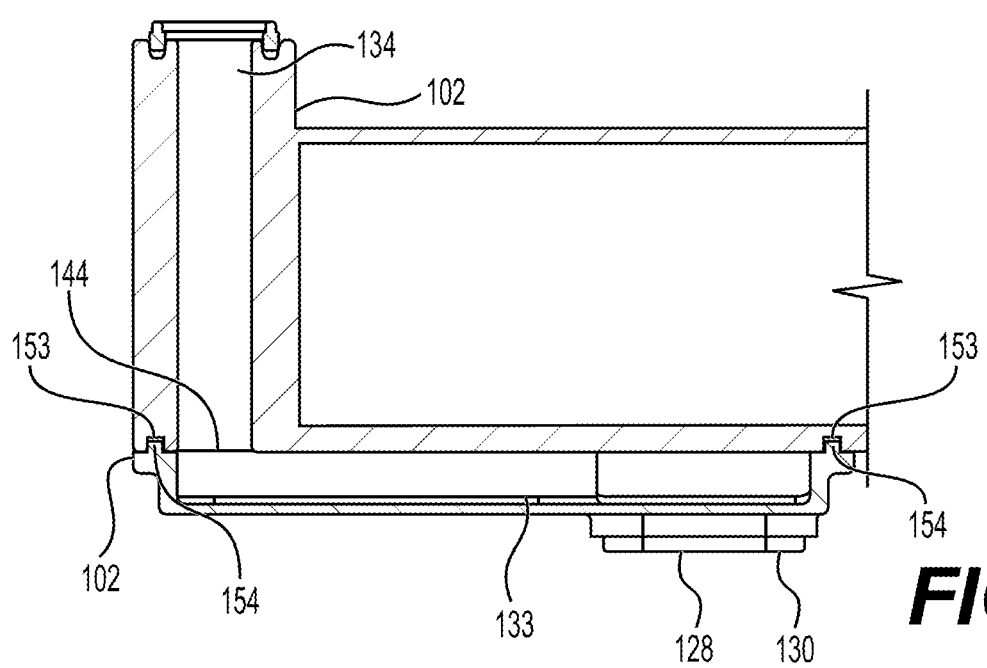
FIG. 11 depicts a side cross sectional view of a capacitor housing.

FIG. 11 displays a side cross-sectional view of the capacitor housing 102 that depicts the lower manifold 132, lower seal 130 and a coolant channel 134. The coolant channel 134 is located within the capacitor housing 102 and defined by a cylindrical or otherwise suitably shaped surface. A proximal end of the coolant channel 134, outlet 144, may attach and be in fluid communication to the proximal end of the lower manifold 132.

Figure 12:
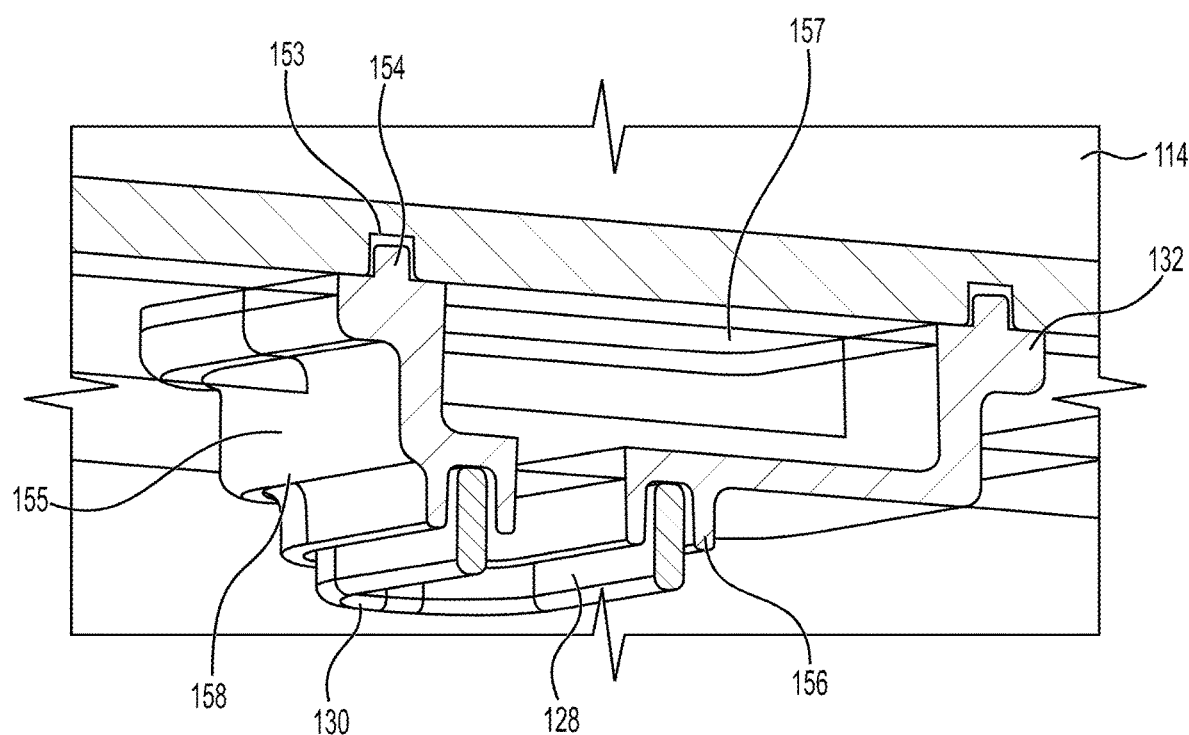
FIG. 12 depicts a cross sectional view of a lower manifold and capacitor housing.

FIG. 12 displays a cross sectional view of a lower manifold 132 and lower seal 130. The lower manifold is depicted as attached to the bottom face 114 of the capacitor housing 102. The bottom face 114 may have a groove or recess 153 that receives the lower manifold 132. In particular, lower manifold 132 may have a protrusion/extension 154 that is received by a matching groove or recess 153 within the bottom face 114. The lower manifold 132 may have a groove or recess 156 that receives the lower manifold seal 130. The lower manifold seal 130 may be ovular in shape, but could be any other suitable shape such as rectangular or any shapes that corresponds to the shape of opening inlet 128 or opening outlet 129. The system also contains an opening inlet 128 which may be any of various shaped openings in the lower manifold. The bottom face 114, lower manifold walls 155, and manifold bottom 158 create a lower manifold cavity 157. The opening inlet 128 allows for fluid communication from outside the lower manifold 132 and the lower manifold cavity 157.

Figure 13A:
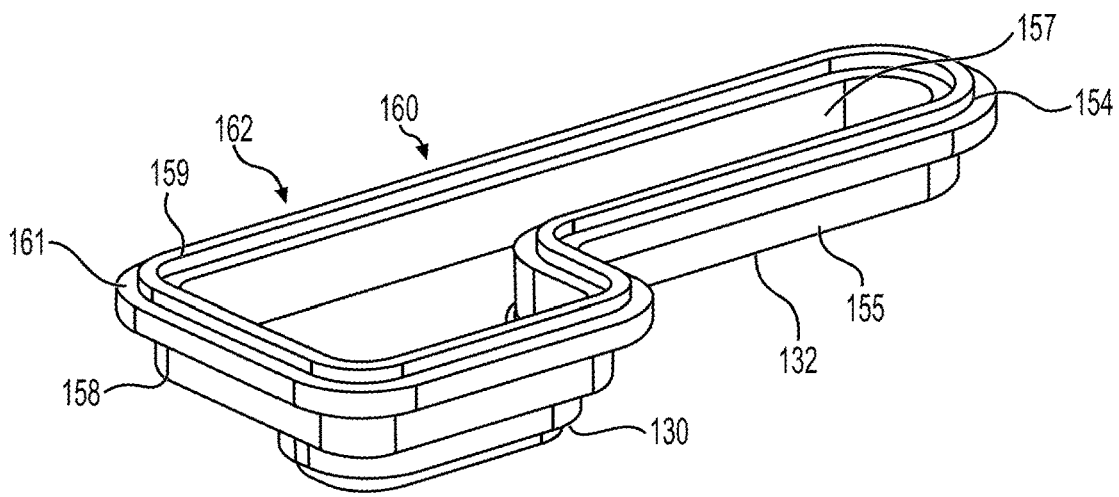
FIG. 13A depicts a perspective view of a lower manifold.

FIG. 13A depicts a perspective view of a lower manifold 132 or 133. The lower manifold depicts a lower manifold cavity 157, which is encompassed by lower manifold walls 155, manifold bottom 158, and a bottom face 114 of capacitor (shown in FIG. 7). The lower manifold cavity 157 is in fluid connection with opening inlet 128. The cavity 157 may also be in fluid connection with inlet 142 or outlet 144 from capacitor housing 102 (shown in FIG. 4) when attached to the bottom face 114 of the capacitor housing 102. A flange 161, may extend circumferentially around the entirety of the cavity 157. Further, a extension 154 wraps around an entire upper face 159 of the lower manifold 132 and extends from the flange 161. The manifold bottom 158 may be shaped in an "L" like formation containing two sections, an elongated portion 160 and a widened portion 162 (shown in FIG. 13A).

Figure 13B:
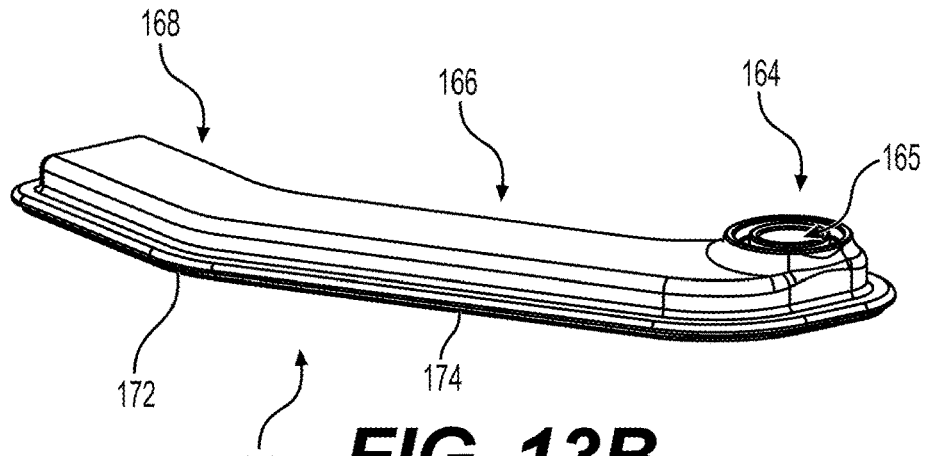
FIGS. 13B-13C depict a perspective view of an upper manifold.
Figure 13C:
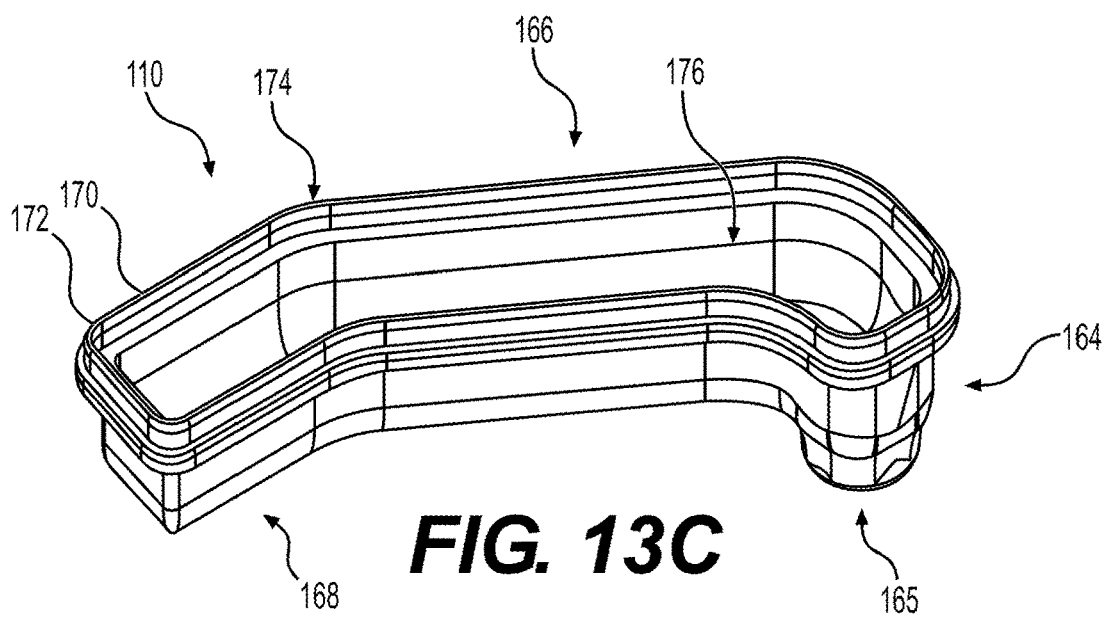

FIG. 13B-13C depicts perspective views of an upper manifold 110 or 111. The upper manifold 110 and 111 depicts an upper manifold cavity 176, which is encompassed by upper manifold walls 178, manifold top 180, and a top face 116 of capacitor (shown in FIG. 7). The upper manifold 110 and 111 may have a protrusion 170 that wraps around the entirety of the lower face 174 of the upper manifolds 110 and 111. A flange 172, follows the entirety of the protrusion on the lower face 174. Upper manifolds 110 and 111 may be formed of 3 sections: a first portion inlet 164, a central portion 166, and a straight portion 168. The first portion inlet 164 may include an opening 165, that may be in fluid communication with the power module 106 or other engine components. The connection may include upper seals 140 (shown in FIG. 4). The central portion 166 may traverse the x/y plane (shown in FIG. 10). Straight portion 168 may be perpendicular to the portion inlet 164 and be in fluid communication with channels 134 and 135 when upper manifold is attached to the top face 116 of the capacitor housing 102 through inlet 150 or outlet 148.

The housing casting 120 and capacitor housing 102 together form an inlet coolant circuit configured to convey coolant toward the capacitor, and an outlet coolant circuit configured to convey coolant away from the capacitor. The inlet coolant circuit may begin at the opening 128 in lower manifold 133, which is located at the opening 146 of casting housing 120. The inlet coolant circuit then includes the lower manifold cavity 157, coolant channel 134, and cavity 176 of upper manifold 111. The inlet coolant circuit ends at opening 165 of the upper manifold 111. The outlet coolant circuit may begin at opening 165 of the upper manifold 110. The outlet coolant circuit then includes cavity 176 of upper manifold 110, coolant channel 135, and lower manifold cavity 157. The outlet coolant circuit end at the opening 129 of lower manifold 132. The opening 129 is located at opening 147 of casting housing 120. In another embodiment, the inlet coolant circuit may be swapped with the outlet coolant circuit and the coolant may flow in the opposite direction.

Figure 14:
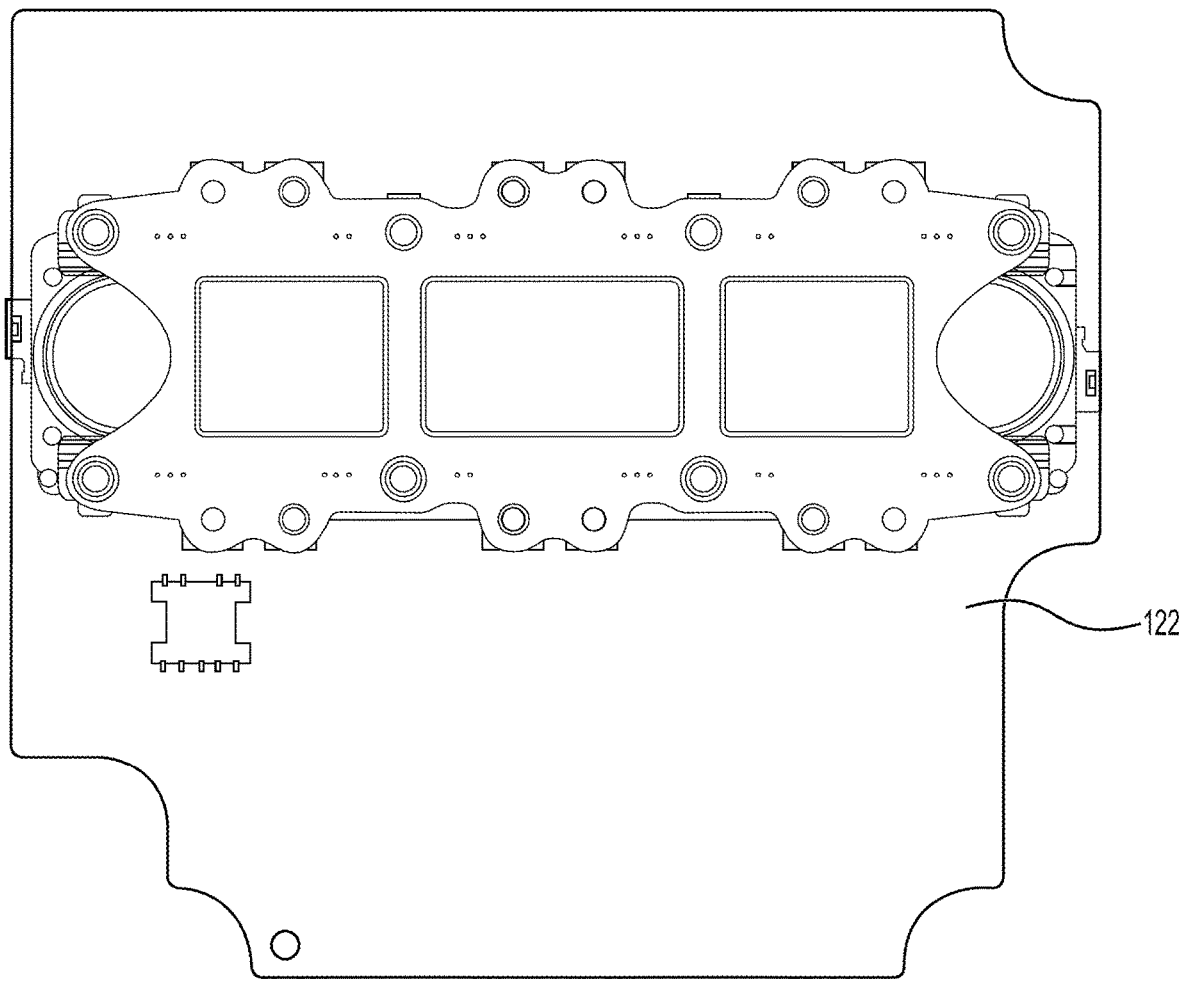
FIG. 14 depicts top view of printed circuit board.

FIG. 14 illustrates a top view of the printed circuit board 122. The printed circuit board 122 may have electrical circuitry (not shown). The printed circuit board 122 may include a substrate made of low temperature co-fired ceramic (LTCC), an organic material such as FR4, a metal such as stainless steel or any other suitable material. The circuit board 122 may include circuitry formed on the top surface and/or bottom surface, as well as between laminated intermediate layers on the circuit board 122. The circuit board 122 may further be configured with electrical circuitry in the form of surface mount components mounted on the circuit board 122, such as resistors, capacitor, diodes, transistors (e.g., FETs and IGBTs), and other semiconductor chips.

In some embodiments, printed circuit board 122 does not include any fluid inlet and outlet ports. In other words, in some embodiments, cooling fluid does not travel through printed circuit board 122 in any capacity. The cutoff within the printed circuit board 122, more specifically the gate driver board, are no longer required to route the coolant from the housing to a power module heatsink. The additional board space area may allow for electrical board layout simplification.

Figure 15:
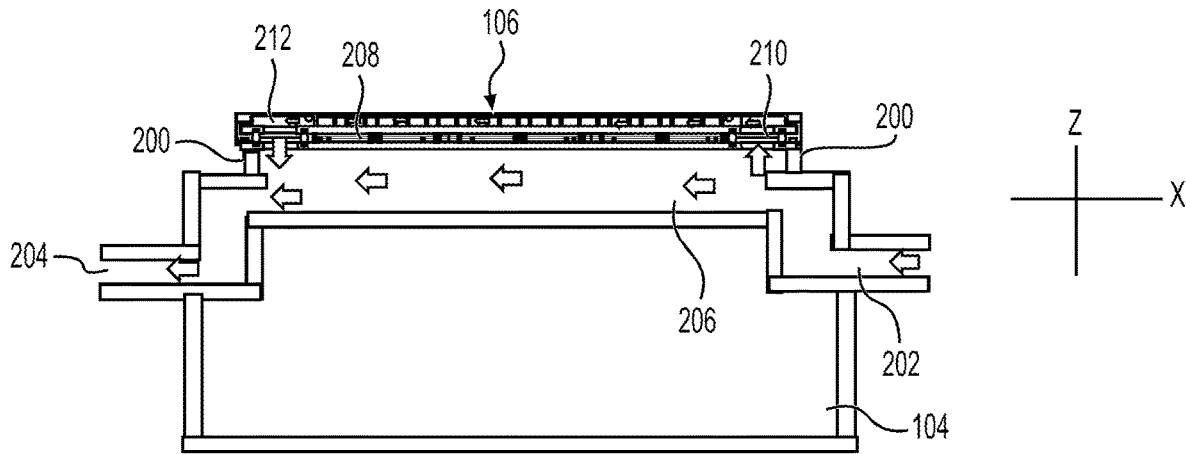
FIG. 15 depicts a cross sectional view of a power module and capacitor.

FIG. 15 displays a cross sectional view of a first embodiment of a power module 106 and coolant system. The system may include a power module 106 stacked or attached to the top of a capacitor 104. A coolant channel 206 may be located in between the capacitor 104 and power module 106. The coolant channel 206 may be configured to have a channel inlet 202 and channel outlet 204 that are in fluid communication with each other via channel 206. The channel inlet 202 and channel outlet 204 may be in fluid communication with capacitor housing 102. The channel inlet 202 may receive coolant from the upper manifold 111 or from other engine components. The channel outlet 204 may disperse coolant into the capacitor housing 102 through upper manifold 110. Alternatively, the channel outlet 204 may disperse the coolant to a heatsink through alternative engine components. Further, there may be a power module seal 200 between the coolant channel 206 and power module 106 to prevent leakage. The power module 106 may include an inlet 210 and outlet 212 on opposing sides of the power module 106. The power module 106 may be configured to have one or more coolant channels within itself. In this embodiment, the power module has one module coolant channel that is in fluid connection from the inlet 210 and outlet 212. In this embodiment, the capacitor housing 102 and the cooling system 100 do not include any heatsink or cold plate. Instead, coolant flows through channel 206 to remove heat (via conduction) directly from the surfaces of power module 106.

Figure 16:
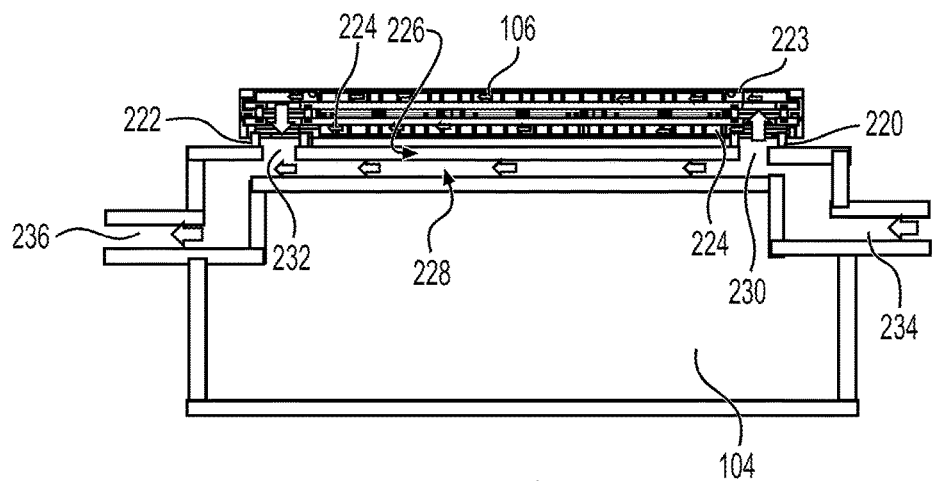
FIG. 16 depicts a cross sectional view of a power module and capacitor.

FIG. 16 displays a displays a cross sectional view of a second and alternative embodiment of a power module 106 and coolant system. In this embodiment, the power module may contain two coolant channels, coolant channel 223 and coolant channel 224. In this embodiment, a thermal pad (heat sink/cold plate) 226 may be located between a coolant channel 228 and a power module 106. Further, the power module 106 may contain a seal 220 located at an inlet 230 into the power module and a seal 222 at an outlet 232. The coolant channel 228 may be located above capacitor 104 (not shown). The coolant channel 228 may be configured to have a channel inlet 234 and channel outlet 236 that are in fluid communication with each other. The channel inlet 234 and channel outlet 236 may be in fluid communication with capacitor housing 102. The channel inlet 235 may receive coolant from the upper manifold 111 or from other engine components. The channel outlet 204 may disperse coolant into the capacitor housing 102 through upper manifold 110. Alternatively, the channel outlet 236 may disperse the coolant to a heatsink through alternative engine components.

The flow of coolant through system 100 is described as follows. One embodiment of a flow path of coolant for the system may be illustrated with reference to FIGS. 3, 4 and 10. Coolant may enter the system through an opening 146 in the housing casting 120 and enter the capacitor housing 102 through opening 128. The coolant may be directed from a heat exchanger or other engine components prior to entering the system 100. The coolant may then enter a first lower manifold 133 and travel along cavity 157 from the widened portion 162 to the elongated portion 160. Next, the coolant exit the lower manifold 133 and enter a coolant channel 134 in the capacitor housing at outlet 144. The coolant may flow through the channel 134 and exit the channel at outlet 148 and flow into the upper manifold 111. The fluid may flow through the upper manifold cavity 176 beginning at the straight portion 168, followed by a central portion 166, and lastly through a first portion inlet 164. The coolant then exits the upper manifold 111. After exiting upper manifold 111, the fluid may then enter the power module 106 and proceed to flow through one or more coolant channels through the system. The coolant may then leave the power module 106 and flow into a second upper manifold 110 through an opening 165 in the first portion inlet 164, followed by a central portion 166, and lastly through a straight portion 168. The fluid will proceed to flow into a second coolant channel 135 at inlet 150. Next the fluid will flow through coolant channel 135 and exit coolant channel 135 at outlet 144 and enter a second lower manifold 132. The fluid may flow through the cavity 157 of lower manifold 132 from elongated portion 160 to widened portion 162 and then the lower manifold 132 out opening 129. Coolant exits the system out opening 128, flowing out of the housing casting 120 opening 147 in the process. The fluid may then proceed to flow through an opening 147 in the housing casting 120 and continue to flow to a radiator, heat exchanger, or to further engine components (not shown). Further, the coolant may absorb heat from the system throughout the process. Additionally, in another embodiment, the coolant may flow in the opposite direction of the first embodiment.

With respect to FIG. 15 and FIG. 16, a fluid path can be illustrated by drawn arrows. In FIG. 15, a fluid may be directed to enter at the channel inlet 202. The fluid may have previously traveled through the capacitor housing 102. The fluid may proceed to flow through the coolant channel 206. The fluid may also enter through inlet 210 and flow through the power module coolant channel 208 and exit the power module coolant channel 208 through outlet 212. The coolant following both arrow sets may then exit through a channel outlet 204. The fluid may then flow back into the capacitor housing 102 and or to a heat exchanger or other engine components to be cooled. The fluid may absorb heat from the power module during this process. In one embodiment, the fluid may flow in the opposite direction described herein.

In FIG. 16, a fluid may be directed to enter at the channel inlet 234. The fluid may have previously flown through the capacitor housing 102. The fluid may proceed to flow through the coolant channel 228. The fluid may also enter through inlet 230 and flow through the power module coolant channel a 223 and coolant channel b 224 and exit through outlet 232. The coolant following both arrows may then exit through a channel outlet 236. The fluid may then flow back into the capacitor housing 102 and or to a heat exchanger or other engine components to be cooled. The fluid may absorb heat from the power module and thermal pad during this process. In one embodiment, the fluid may flow in the opposite direction described herein.

The multiple embodiments may lead to a power module performance increase due to getter and more efficient cooling.

Figure 17:
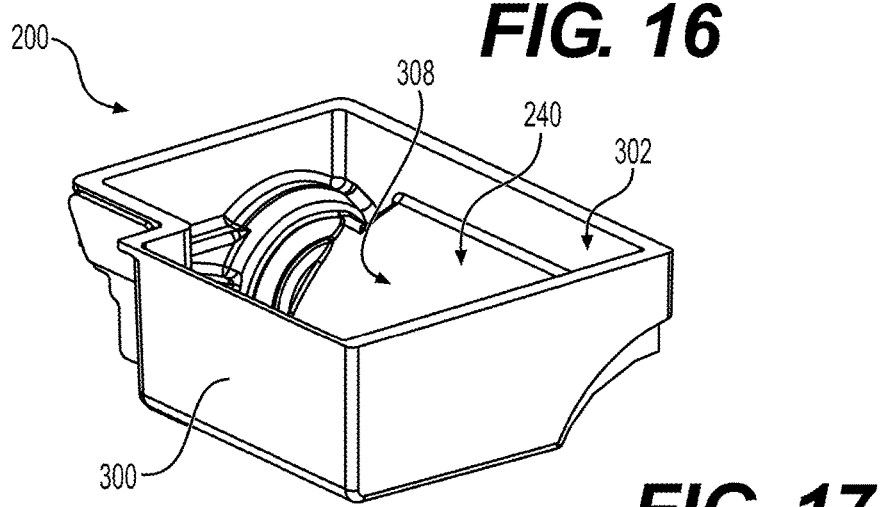
FIG. 17 depicts a perspective view of the housing casting.

FIG. 17 depicts a perspective view of the housing casting 120. The housing casting may define a cavity 308 that serves as the base for the capacitor system for an electrically-powered vehicle 100 (not shown). The housing casting includes a curved section shaped to contact the wheel well 240.). The capacitor housing 102 may generally be placed on top of the housing casting 120 and may be screwed into the housing casting 120.

The housing casting may not include complex fabrication. Further, the problem of a vertical packaging constraint, is solved by the capacitor and power module system 100 utilizing the space within the housing casting 120 more efficiently.

What is claimed is:

1. A cooling system for a capacitor, the cooling system comprising:
    a housing for the capacitor, the housing comprising of a bottom surface, a top surface, and at least one side surface connecting the bottom surface and the top surface,
    the housing further including:
        a bottom inlet manifold and a bottom outlet manifold extending along the bottom surface, the bottom inlet manifold including:
            a cavity;
            a flange extending circumferentially around the cavity; and
            a protrusion extending from the flange, the protrusion also extending circumferentially around the cavity;
        an inlet side channel extending along the side surface, the inlet side channel being in fluid communication with the bottom inlet manifold;
        an outlet side channel extending along the side surface, the outlet side channel being in fluid communication with the bottom outlet manifold;
        a top inlet manifold extending along the top surface, the top inlet manifold being in fluid communication with the inlet side channel; and
        a top outlet manifold extending along the top surface, the top outlet manifold being in fluid communication with the outlet side channel.

2. The cooling system of claim 1, wherein the top inlet manifold includes an opening, and the top outlet manifold includes an opening, wherein the opening of the top inlet manifold and the opening of the top outlet manifold are fluidically separated in the absence of an intermediate conduit.

3. The cooling system of claim 1, wherein the bottom surface of the housing includes an inlet manifold recess having a shape corresponding to a shape of the protrusion, wherein the inlet manifold recess receives the protrusion of the bottom inlet manifold when the bottom inlet manifold is coupled to the bottom surface.

4. The cooling system of claim 1, wherein in a first plane, the protrusion extends completely and uninterrupted around a first circumference of the cavity.

5. The cooling system of claim 4, wherein in a second plane substantially parallel to the first plane, the flange extends completely and uninterrupted around a second circumference of the cavity.

6. The cooling system of claim 5, wherein the bottom outlet manifold includes:
    a cavity;
    a flange extending circumferentially around the cavity; and
    a protrusion extending from the flange, the protrusion also extending circumferentially around the cavity, wherein:
        the bottom surface of the housing includes an outlet manifold recess having a shape corresponding to a shape of the protrusion of the bottom outlet manifold, wherein the outlet manifold recess receives the protrusion of the bottom outlet manifold when the bottom outlet manifold is coupled to the bottom surface;
        in the first plane, the protrusion of the bottom outlet manifold extends completely and uninterrupted around a first circumference of the cavity of the bottom outlet manifold; and
        in the second plane, the flange of the bottom outlet manifold extends completely and uninterrupted around a second circumference of the cavity of the bottom outlet manifold.

7. The cooling system of claim 6, wherein the cavity of the bottom inlet manifold forms part of an inlet cooling circuit when the bottom inlet manifold is coupled to the bottom surface of the housing, and the cavity of the bottom outlet manifold forms part of an outlet cooling circuit when the bottom outlet manifold is coupled to the bottom surface of the housing.

8. The cooling system of claim 1, further including a casting housing configured to at least partially receive the housing for the capacitor.

9. The cooling system of claim 8, wherein the casting housing is configured to be directly attached to a frame of a vehicle.

10. The cooling system of claim 9, wherein the casting housing is formed substantially of metal and the housing for the capacitor is formed substantially of plastic.

11. The cooling system of claim 1, further including the capacitor, wherein the capacitor is enclosed by the housing.

12. An electrically-powered vehicle comprising the cooling system of claim 1.

13. A cooling system for a capacitor, the cooling system comprising:
    a housing for the capacitor, the housing comprising of a bottom surface, a top surface, and at least one side surface connecting the bottom surface and the top surface,
    the housing further including:
        a bottom inlet manifold and a bottom outlet manifold extending along the bottom surface;
        an inlet side channel extending along the side surface, the inlet side channel being in fluid communication with the bottom inlet manifold;
        an outlet side channel extending along the side surface, the outlet side channel being in fluid communication with the bottom outlet manifold;
        a top inlet manifold extending along the top surface, the top inlet manifold being in fluid communication with the inlet side channel; and
        a top outlet manifold extending along the top surface, the top outlet manifold being in fluid communication with the outlet side channel; and
    a casting housing configured to at least partially receive the housing for the capacitor, wherein the casting housing includes inlet opening and an outlet opening, wherein a portion of the bottom inlet manifold extends through the inlet opening, and a portion of the bottom outlet manifold extends through the outlet opening.

14. The cooling system of claim 13, wherein the inlet opening and the outlet opening are the only portions of the casting housing through which a coolant is configured to flow.

15. A cooling system for a capacitor, the cooling system comprising:
    a housing for the capacitor, the housing including:
        a first surface,
        a second surface, a third surface connecting the first surface and the second surface,
an inlet coolant circuit configured to convey coolant towards the capacitor, the inlet coolant circuit extending along the first surface, the second surface, and the third surface of the housing, and
an outlet coolant circuit configured to convey coolant away from the capacitor,
wherein the inlet coolant circuit includes a manifold on the first surface, the manifold including:
a cavity,
a flange extending around the cavity, and
a protrusion extending from the flange; and
a casting configured to at least partially enclose the housing.

16. The cooling system of claim 15, wherein the casting housing includes an inlet opening and an outlet opening, wherein a portion of the inlet coolant circuit extends through the inlet opening and a portion of the outlet coolant circuit extends through the outlet opening.

17. The cooling system of claim 15, wherein the casting is configured to be directly attached to a frame of a vehicle.

18. The cooling system of claim 15, wherein the casting is formed substantially of metal and the housing for the capacitor is formed substantially of plastic.

19. The cooling system of claim 15, further including the capacitor, wherein the capacitor is enclosed by the housing.

20. The cooling system of claim 15,
wherein the casting includes an inlet opening, and
wherein a portion of the flange of the manifold extends through the inlet opening.

* * * * *

UNITED STATES PATENT AND TRADEMARK OFFICE
CERTIFICATE OF CORRECTION

PATENT NO. : 11,785,737 B2
APPLICATION NO. : 17/580375
DATED : October 10, 2023
INVENTOR(S) : Pascal David, Mark Alan Ebenhart and Marc Cipriano It is certified that error appears in the above-identified patent and that said Letters Patent is hereby corrected as shown below:

On the Title Page

Column 1 Item (73) (Assignee), Line 1, delete "Borg Warner" and insert --BorgWarner--.

In the Claims

Column 15, Line 17, In Claim 16, delete "housing includes" and insert --includes--.

Signed and Sealed this
Nineteenth Day of December, 2023

Katherine Kelly Vidal
*Director of the United States Patent and Trademark Office*